United States Patent
Ortiz et al.

(10) Patent No.: US 10,411,660 B1
(45) Date of Patent: Sep. 10, 2019

(54) DIFFERENTIAL POWER AMPLIFIER

(71) Applicant: Qorvo US, Inc., Greensboro, NC (US)

(72) Inventors: Jeffery Peter Ortiz, Chandler, AZ (US); Yan Li, Phoenix, AZ (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/927,141

(22) Filed: Mar. 21, 2018

(51) Int. Cl.
| | |
|---|---|
| H03F 3/04 | (2006.01) |
| H03F 3/193 | (2006.01) |
| H03F 3/24 | (2006.01) |
| H03F 3/45 | (2006.01) |
| H03F 1/34 | (2006.01) |

(52) U.S. Cl.
CPC ............ *H03F 3/193* (2013.01); *H03F 1/347* (2013.01); *H03F 3/245* (2013.01); *H03F 3/45179* (2013.01); *H03F 2200/451* (2013.01); *H03F 2203/45644* (2013.01)

(58) Field of Classification Search
CPC .......... H03F 3/193; H03F 1/347; H03F 3/245; H03F 3/45179; H03F 2200/451; H03F 2203/45644
USPC ................. 330/253, 195, 165, 302
See application file for complete search history.

(56) References Cited

U.S. PATENT DOCUMENTS 7,471,156 B2 * 12/2008 Thompson .............. H03F 1/565 330/276

* cited by examiner

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A differential power amplifier is disclosed. The differential power amplifier includes an output transformer having a primary winding with a first primary terminal, a center-tap terminal, and a second primary terminal. The differential power amplifier further includes a positive amplifier having a first signal output terminal coupled to the first primary terminal and a negative amplifier having a second signal output terminal coupled to the second primary terminal. A harmonic tuning network is made up of a common-mode inductor coupled between the center-tap terminal and a tuning node and a first electronically tunable capacitor coupled between the tuning node and a fixed voltage node. A controller is configured to tune the electronically tunable capacitor to resonate with the common-mode inductor at a second harmonic frequency of a signal being amplified by the positive amplifier and the negative amplifier.

19 Claims, 5 Drawing Sheets

DIFFERENTIAL POWER AMPLIFIER

FIELD OF THE DISCLOSURE

The present disclosure is directed to amplifiers employed by electronic communication equipment such as cellular handsets.

BACKGROUND

The complexity of cellular handsets is ever increasing due increasing frequency band proliferation that results in ever-stricter linear operation specifications. Second harmonic generation by power amplifiers is a major linear operation issue that is addressed in part by adding duplex filters to cellular handsets for most of the frequency bands of operation of a cellular handset. Duplex filters are costly with regard to cellular handset real estate. As such, attention is now increasingly turning toward improving power amplifier linearity so that fewer duplexers and power amplifiers are needed to operate across all frequency bands desired. Thus, a power amplifier having improved linearity is needed, and a particular type of amplifier needing improved linearity is the differential power amplifier.

SUMMARY

A differential power amplifier is disclosed. The differential power amplifier includes an output transformer having a primary winding with a first primary terminal, a center-tap terminal, and a second primary terminal. The differential power amplifier further includes a positive amplifier having a first signal output terminal coupled to the first primary terminal and a negative amplifier having a second signal output terminal coupled to the second primary terminal. A harmonic tuning network is made up of a common-mode inductor coupled between the center-tap terminal and a tuning node and a first electronically tunable capacitor coupled between the tuning node and a fixed voltage node. A controller having a control output terminal coupled to a control input terminal of the first electronically tunable capacitor is configured to tune the first electronically tunable capacitor to resonate with the common-mode inductor at a second harmonic frequency of a signal being amplified by the positive amplifier and the negative amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
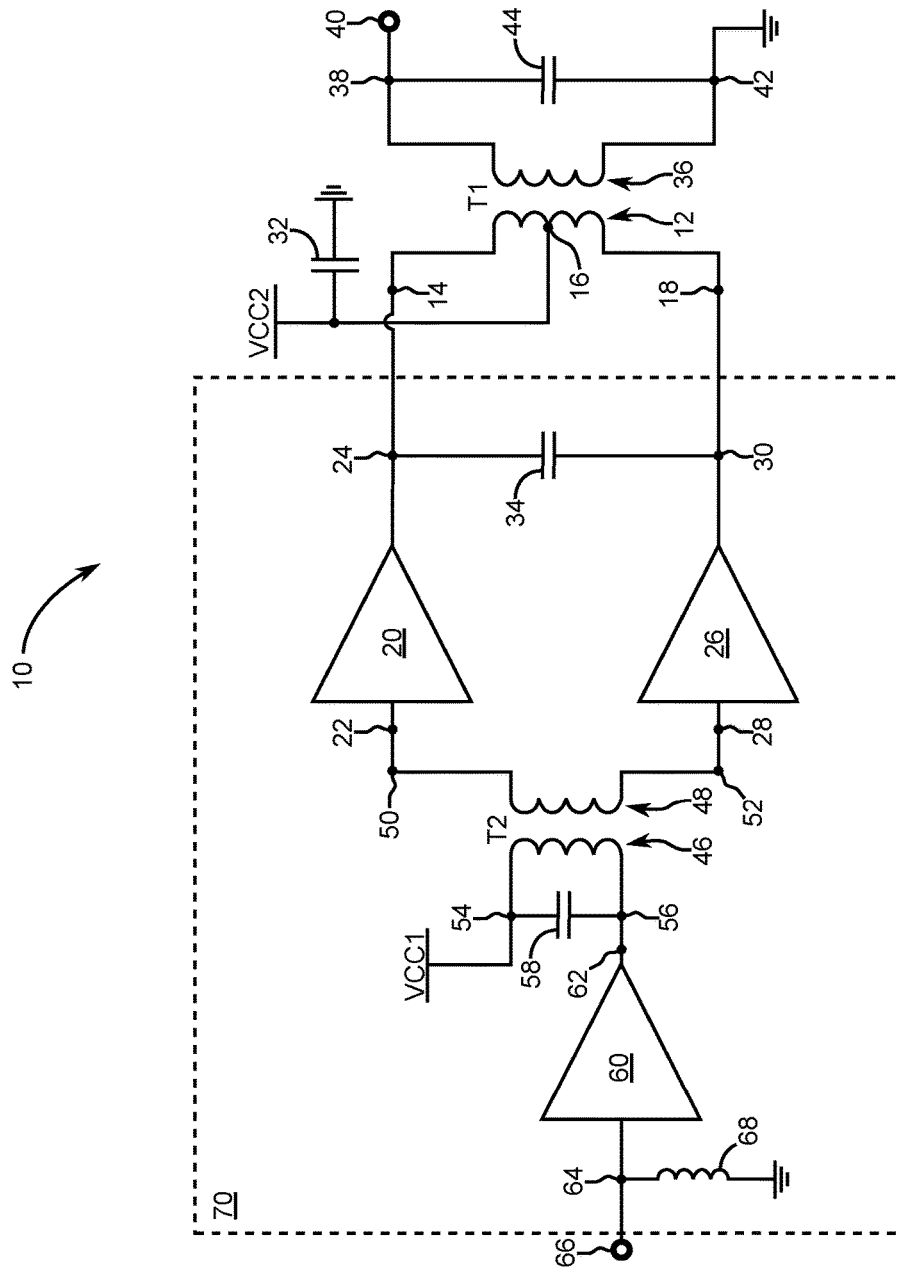
FIG. 1 is a schematic of a related-art differential power amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or element is referred to as extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, a transformer is defined herein as having at least a primary winding and a secondary winding wherein the primary winding and secondary winding are magnetically coupled through mutual induction.

FIG. 1 is a schematic of a related-art differential power amplifier 10. The related-art differential power amplifier 10 includes an output transformer T1 having a primary winding 12 with a first primary terminal 14, a center-tap terminal 16, and a second primary terminal 18. The related-art differential power amplifier 10 further includes a positive amplifier 20 having a first signal input terminal 22 for receiving a first portion of a radio frequency (RF) signal to be amplified and a first signal output terminal 24 for providing an amplified version of the first portion of the RF signal. The first signal output terminal 24 is coupled to the first primary terminal 14. Further included is a negative amplifier 26 having a second signal input terminal 28 for receiving a second portion of the RF signal to be amplified and a second signal output terminal 30 for providing an amplified version of the second portion of the RF signal. The second signal output terminal 30 is coupled to the second primary terminal 18. A direct current (DC) blocking capacitor 32 is coupled between the center-tap terminal 16 and ground, while the center-tap terminal 16 is also coupled to a voltage supply node VCC2. A first fixed tuning capacitor 34 is coupled between the first primary terminal 14 and the second primary terminal 18 to reduce power loss due to leakage associated with the primary winding 12.

The output transformer T1 has a secondary winding 36 that has a first secondary terminal 38 coupled to a single-ended output terminal 40 and a second secondary terminal 42 coupled to ground. A second fixed tuning capacitor 44 is coupled between the first secondary terminal 38 and the second secondary terminal 42 to reduce power loss due to leakage associated with the secondary winding 36.

The related-art differential power amplifier 10 further includes an input transformer T2 having a primary winding 46 and a secondary winding 48. The secondary winding 48 includes a first secondary terminal 50 coupled to the first signal input terminal 22 and a second secondary terminal 52 coupled to the second signal input terminal 28. The primary winding 46 has a first primary terminal 54 coupled to a voltage supply node VCC1 and a second primary terminal 56. A third fixed tuning capacitor 58 is coupled between the first primary terminal 54 and the second primary terminal 56 to reduce power loss due to leakage associated with the primary winding 46.

The related-art differential power amplifier 10 further includes an input amplifier 60 having a signal output terminal 62 coupled to the primary winding 46 of the input transformer T2 by way of the second primary terminal 56. The input amplifier 60 has a single-ended input terminal 64 that is coupled to an RF signal terminal 66. An impedance matching inductor 68 is coupled between the single-ended input terminal 64 and ground. An integrated circuit die 70 integrates the input amplifier 60 with the positive amplifier 20 and the negative amplifier 26.

Figure 2:
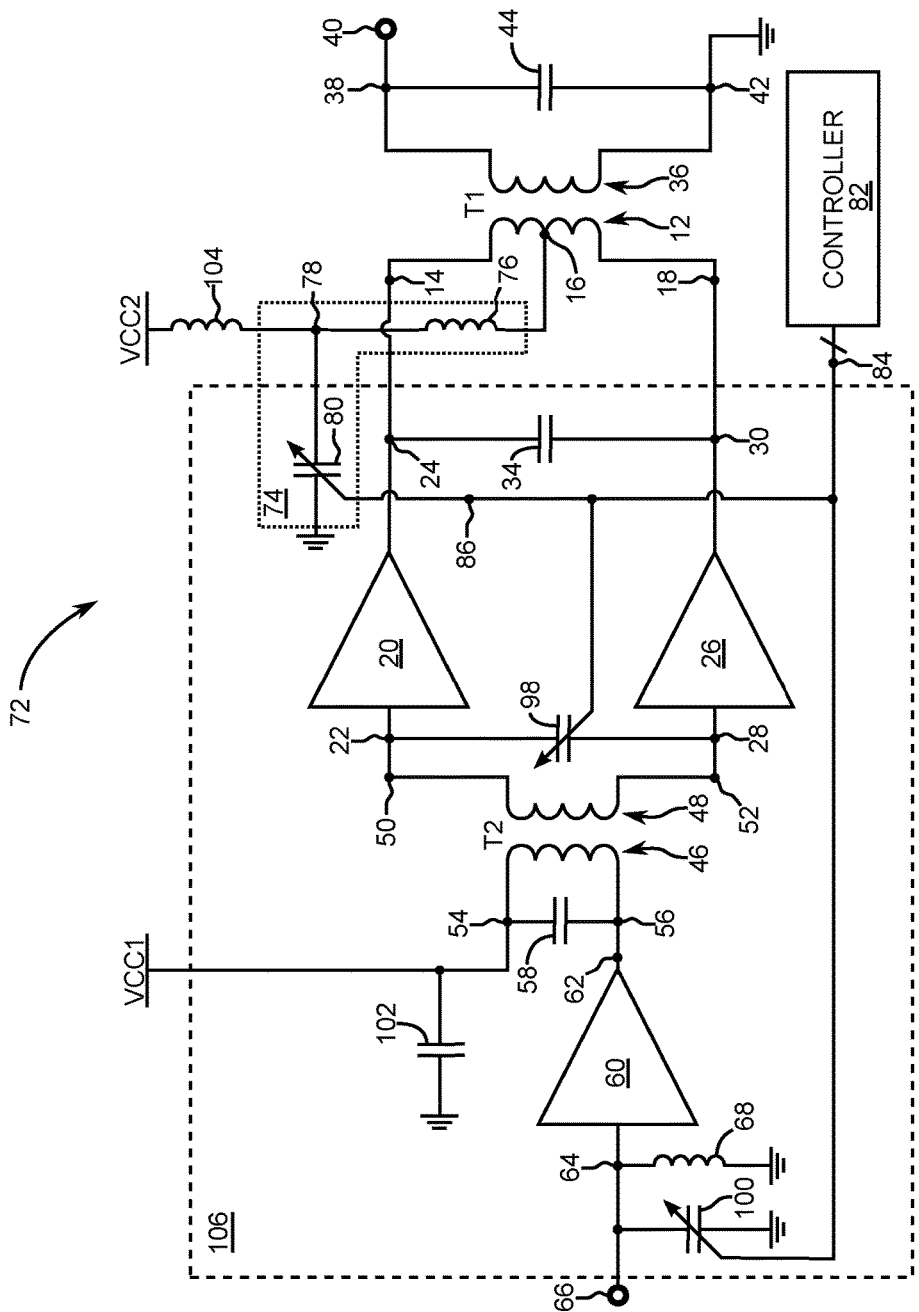
FIG. 2 is a schematic of an exemplary embodiment of a differential power amplifier of the present disclosure.

FIG. 2 is a schematic of an exemplary embodiment of a differential power amplifier 72 of the present disclosure. In the exemplary embodiment of the differential power amplifier 72, a harmonic tuning network 74 is included to improve linearity performance and power-added efficiency of the differential power amplifier 72 over the related-art differential power amplifier 10 of FIG. 1. The harmonic tuning network 74 includes a common-mode inductor 76 coupled between the center-tap terminal 16 and a tuning node 78. In at least one embodiment, the common-mode inductor 76 has a fixed inductance value to provide an improved overall quality Q for the harmonic tuning network 74. Further included in the harmonic tuning network 74 is a first electronically tunable capacitor 80 coupled between the tuning node 78 and ground.

A controller 82 has a control output terminal 84 coupled to a control input terminal 86 of the first electronically tunable capacitor 80. The controller 82 is configured to tune the first electronically tunable capacitor 80 to resonate with the common-mode inductor 76 at a harmonic frequency of a signal being amplified by the positive amplifier 20 and the negative amplifier 26. In the exemplary embodiment of FIG. 2, the controller 82 is a digital controller that provides a digital control signal through the control output terminal 84. The harmonic frequency is typically the second harmonic frequency of the signal being amplified. Also in exemplary embodiments, the controller 82 is configured to automatically adjust the first electronically tunable capacitor 80 to a different corresponding capacitance value for a different selected frequency of operation for the signal being amplified.

Figure 3:
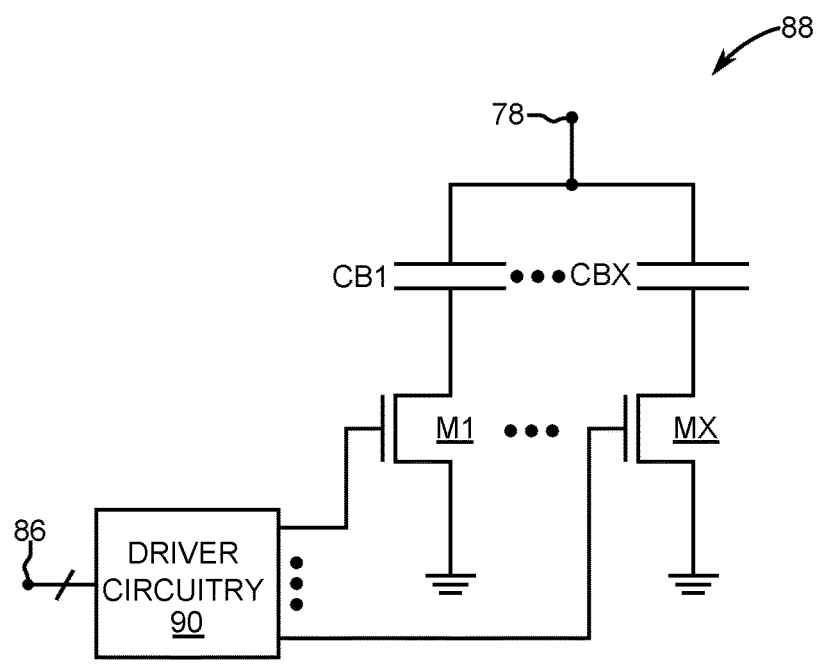
FIG. 3 is a schematic of an exemplary electronically tunable capacitor that is embodied as a digitally programmable capacitor array.

FIG. 3 is a schematic depicting a digitally programmable capacitor array 88 that is usable for the first electronically tunable capacitor 80 (FIG. 2). In the exemplary embodiment of FIG. 3, the digitally programmable capacitor array 88 is coupled between the tuning node 78, the control terminal 86, and ground. The digitally programmable capacitor array 88 includes a plurality of capacitors CB1-CBX, wherein X is a finite number of capacitors. Each of the plurality of capacitors CB1-CBX is switchable via field-effect transistor (FET) switches M1-MX, wherein X is a finite number of FET switches. Tuning of the digitally programmable capacitor array 88 is accomplished by turning on and off selected ones of the FET switches M1-MX by way of the control terminal 86. The digitally programmable capacitor array 88 may include driver circuitry 90 that provides drive signals for ensuring that the FET switches M1-MX are fully turn on and off when selected and deselected. In an exemplary embodiment, the digitally programmable capacitor array 88 is made up of integrated capacitors having binary-weighted capacitance values.

Figure 4:
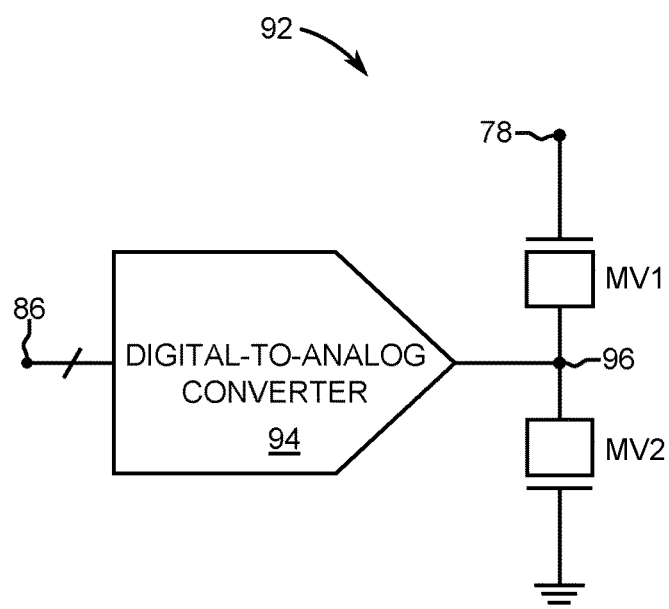
FIG. 4 is a schematic of an exemplary electronically tunable capacitor that is varactor-based.

FIG. 4 is a schematic depicting another electronically tunable capacitor 92 that is usable for the first electronically tunable capacitor 80 (FIG. 2). In this exemplary embodiment, the electronically tunable capacitor 92 is varactor-based. In this case, a first metal oxide semiconductor (MOS) varactor MV1 and a second MOS varactor MV2 are coupled in series between the tuning node 78 and ground. A digital-to-analog converter 94 has an output terminal 96 coupled between the first MOS varactor MV1 and the second MOS varactor MV2. The digital-to-analog converter 94 is configured to be controlled by the controller 82 (FIG. 2) by way of the control terminal 86. The controller 82 sends a digital value to the digital-to-analog converter 94, which in response outputs a tuning voltage for the first MOS varactor MV1 and the second MOS varactor MV2 at the output terminal 96.

Returning to FIG. 2, a second electronically tunable capacitor 98 and a third electronically tunable capacitor 100 may be added to further enhance the performance of the differential power amplifier 72. The second electronically tunable capacitor 98 is coupled between the first signal input terminal 22 and the second signal input terminal 28 to reduce power loss due to leakage associated with the secondary winding 48. The third electronically tunable capacitor 100 is coupled between the single-ended input terminal 64 and ground to combine with the impedance matching inductor 68 to form an electronically tunable input impedance matching network that provides improved impedance matching for the input amplifier 60. Both the second electronically tunable capacitor 98 and a third electronically tunable capacitor 100 have capacitance values that are set by the controller 82 in response to a change frequency of the signal being amplified. Note that the first fixed tuning capacitor 34 and the second fixed tuning capacitor 44 may be replaced with electronically tunable type capacitors as well. A filter capacitor 102 may be coupled between the voltage supply node VCC1 and ground, and an RF choke coil 104 may be added between the voltage supply node VCC2 and the tuning node 78.

In the exemplary embodiment of FIG. 2, the first electronically tunable capacitor 80 is integrated with the input amplifier 60 and with the positive amplifier 20 and the negative amplifier 26 by way of an integrated circuit die 106. However, it is to be understood that the first electronically tunable capacitor 80 may be advantageously integrated with external circuitry such as a silicon-on-insulator circuitry (not shown). For example, the primary winding 12 may have either an even or odd number of windings, and due to proximity there may be an advantage in not integrating the first electronically tunable capacitor 80 onto the integrated circuit die 106 in a case of an odd number of windings for the primary winding 12.

Figure 5:
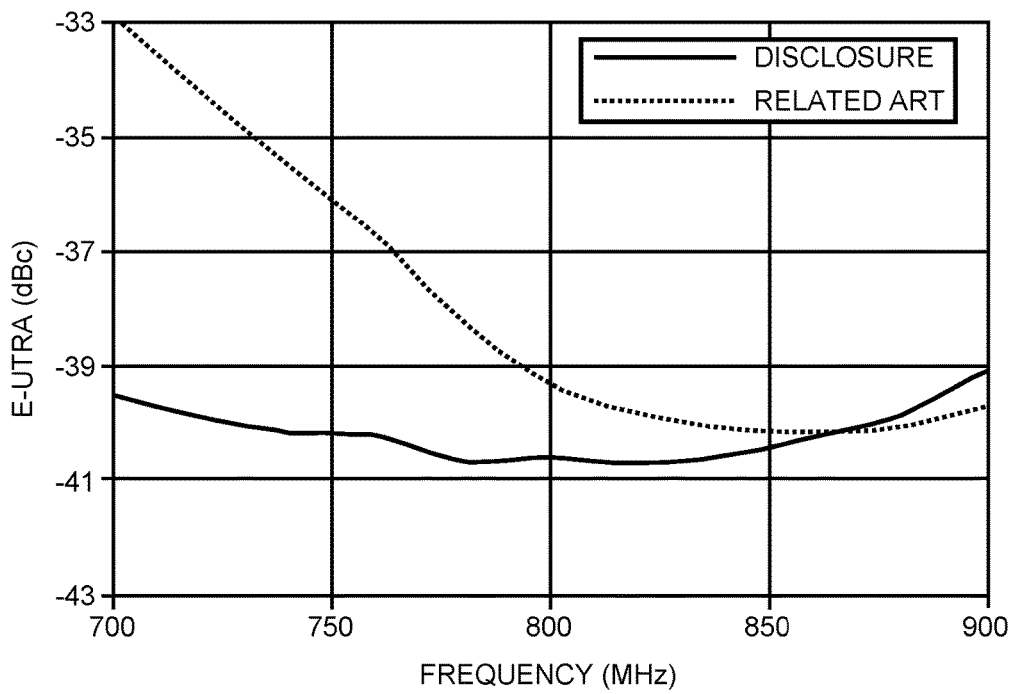
FIG. 5 is a graph depicting a comparison of linearity between the related-art differential power amplifier of FIG. 1 and the disclosed differential power amplifier of FIG. 2 for an Evolved Universal Terrestrial Radio Access (E-UTRA) application for a lower frequency band.

FIG. 5 is a graph depicting a comparison of linearity between the related-art differential power amplifier 10 of FIG. 1 and the disclosed differential power amplifier 72 of FIG. 2 for an Evolved Universal Terrestrial Radio Access (E-UTRA) application for a lower frequency band that extends from 700 MHz to 900 MHz. The linearity of the disclosed differential power amplifier 72 of FIG. 2 is measured in decibels relative to the carrier of a signal amplified by the disclosed differential power amplifier 72. In particular, the linearity measured for the disclosed differential power amplifier 72 is from −39 dBc to −41 dBc for the lower frequency band that extends from 700 MHz to 900 MHz.

Figure 6:
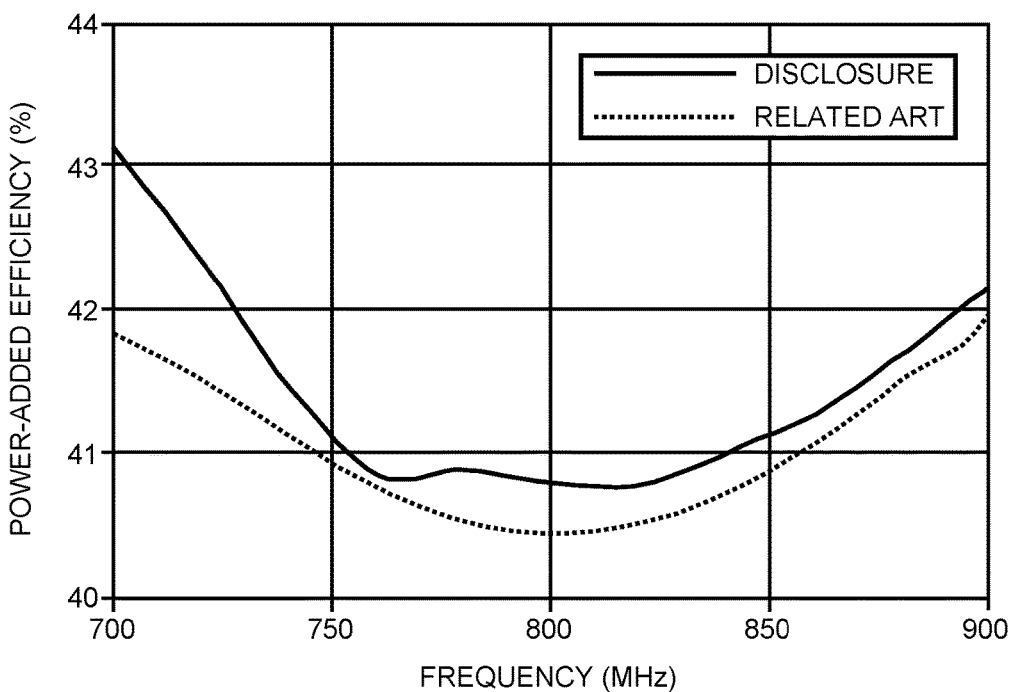
FIG. 6 is a graph depicting a comparison of power-added efficiency between the related-art differential power amplifier of FIG. 1 and the disclosed differential power amplifier of FIG. 2 for the lower frequency band.

FIG. 6 is a graph depicting a comparison of power-added efficiency between the related-art differential power amplifier 10 of FIG. 1 and the disclosed differential power amplifier 72 of FIG. 2 for the lower frequency band that extends from 700 MHz to 900 MHz. In particular, the graph of FIG. 6 depicts the power-added efficiency for the disclosed differential power amplifier 72 is from 40.5% to 42% for the lower frequency band that extends from 700 MHz to 900 MHz.

Figure 7:
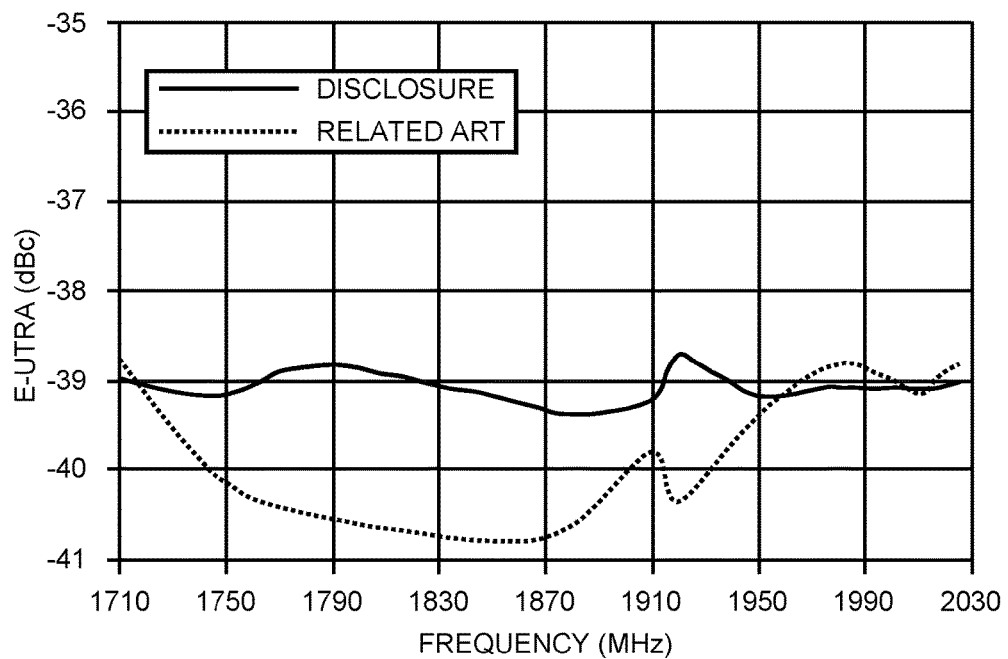
FIG. 7 is a graph depicting a comparison of linearity between the related-art differential power amplifier of FIG. 1 and the disclosed differential power amplifier of FIG. 2 for an E-UTRA application for a higher frequency band.

FIG. 7 is a graph depicting a comparison of linearity between the related-art differential power amplifier 10 of FIG. 1 and the disclosed differential power amplifier 72 of FIG. 2 for an E-UTRA application for a higher frequency band. In the graph of FIG. 7, the disclosed differential power amplifier 72 of FIG. 2 has a linearity measured in decibels relative to the carrier of a signal amplified by the disclosed differential power amplifier 72. In particular, the linearity measured for the disclosed differential power amplifier 72 is from −38.7 dBc to −39.4 dBc for a frequency band that extends from 1710 MHz to 2030 MHz.

Figure 8:
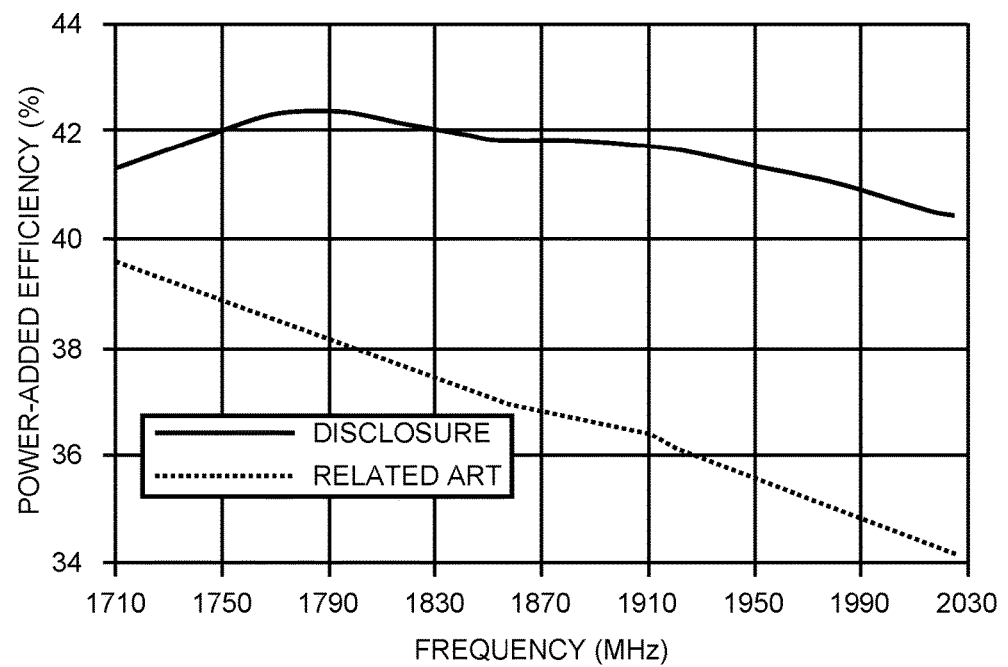
FIG. 8 is a graph depicting a comparison of power-added efficiency between the related-art differential power amplifier of FIG. 1 and the disclosed differential power amplifier of FIG. 2 for the higher frequency band.

FIG. 8 is a graph depicting a comparison of power-added efficiency between the related-art differential power amplifier 10 of FIG. 1 and the disclosed differential power amplifier 72 of FIG. 2 for the higher frequency band. In particular, the graph of FIG. 8 depicts the power-added efficiency for the disclosed differential power amplifier 72 is from 40% to 42.5% for a frequency band that extends from 1710 MHz to 2030 MHz.

Those skilled in the art will recognize improvements and modifications to the preferred embodiments of the present disclosure. All such improvements and modifications are considered within the scope of the concepts disclosed herein and the claims that follow.

What is claimed is:

1. A differential power amplifier comprising:
    an output transformer having a primary winding with a first primary terminal, a center-tap terminal, and a second primary terminal;
    a positive amplifier having a first signal output terminal coupled to the first primary terminal and a first signal input terminal;
    a negative amplifier having a second signal output terminal coupled to the second primary terminal and a second signal input terminal;
    a harmonic tuning network comprising:
        a common-mode inductor coupled between the center-tap terminal and a tuning node; and
        a first electronically tunable capacitor coupled between the tuning node and a fixed voltage node, wherein when an RF choke coil is coupled between the tuning node and a voltage supply node, the RF choke coil suppresses RF signals from passing from the tuning node to the voltage supply node.

2. The differential power amplifier of claim 1 further including a controller having a control output terminal coupled to a control input terminal of the first electronically tunable capacitor, wherein the controller is configured to tune the first electronically tunable capacitor to resonate with the common-mode inductor at a harmonic frequency of a signal being amplified by the positive amplifier and the negative amplifier.

3. The differential power amplifier of claim 2 wherein the first electronically tunable capacitor is a varactor having a variable capacitance.

4. The differential power amplifier of claim 3 wherein the controller is configured to provide a tuning voltage at the control output terminal to adjust the variable capacitance of the varactor.

5. The differential power amplifier of claim 2 wherein the first electronically tunable capacitor comprises a digitally programmable capacitor array.

6. The differential power amplifier of claim 5 wherein the controller is configured to provide a digital control signal at the control output terminal to tune the digitally programmable capacitor array.

7. The differential power amplifier of claim 1 wherein the fixed voltage node is ground.

8. The differential power amplifier of claim 1 further including an input transformer having a secondary winding with a first secondary terminal coupled to the first signal input terminal and a second secondary terminal coupled to the second signal input terminal.

9. The differential power amplifier of claim 2 further including a second electronically tunable capacitor coupled between the first signal input terminal and the second signal input terminal.

10. The differential power amplifier of claim 9 wherein the second electronically tunable capacitor is a varactor having a variable capacitance.

11. The differential power amplifier of claim 9 wherein the second electronically tunable capacitor comprises a digitally programmable capacitor array configured to respond to a digital control signal provided at the control output terminal to tune a total capacitance of the second electronically tunable capacitor.

12. The differential power amplifier of claim 2 further comprising:
an input transformer having a primary winding and a secondary winding, wherein the secondary winding includes a first secondary terminal coupled to the first signal input terminal and a second secondary terminal coupled to the second signal input terminal; and
a second electronically tunable capacitor coupled between the first secondary terminal and the second secondary terminal.

13. The differential power amplifier of claim 12 further including an input amplifier having a signal output terminal coupled to the primary winding of the input transformer.

14. The differential power amplifier of claim 13 further including an electronically tunable input impedance matching network coupled to a signal input terminal of the input amplifier.

15. The differential power amplifier of claim 14 wherein the electronically tunable input impedance matching network includes a third electronically tunable capacitor configured to respond to a digital control signal provided at the control output terminal to tune a total capacitance of the third electronically tunable capacitor.

16. The differential power amplifier of claim 1 wherein linearity of the differential power amplifier measured in decibels relative to a carrier of a signal amplified by the differential power amplifier is from −39 dBc to −41 dBc for a frequency band that extends from 700 MHz to 900 MHz.

17. The differential power amplifier of claim 1 wherein linearity of the differential power amplifier measured in decibels relative to a carrier of a signal amplified by the differential power amplifier is from −38.7 dBc to −39.4 dBc for a frequency band that extends from 1710 MHz to 2030 MHz.

18. The differential power amplifier of claim 1 wherein power-added efficiency for the differential power amplifier is from 40.5% to 42% for a frequency band that extends from 700 MHz to 900 MHz.

19. The differential power amplifier of claim 1 wherein power-added efficiency for the differential power amplifier is from 40% to 42.5% for a frequency band that extends from 1710 MHz to 2030 MHz.

* * * * *